(12) United States Patent
Araki et al.

(10) Patent No.: US 7,663,420 B2
(45) Date of Patent: Feb. 16, 2010

(54) MOS RESISTANCE CONTROLLING DEVICE AND MOS ATTENUATOR

(75) Inventors: Yuta Araki, Tokyo (JP); Shoji Otaka, Yokohama (JP); Toru Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/936,214

(22) Filed: Nov. 7, 2007

(65) Prior Publication Data

US 2008/0204107 A1   Aug. 28, 2008

(30) Foreign Application Priority Data

Nov. 9, 2006 (JP) ............ P2006-303775

(51) Int. Cl.
*H03L 5/00* (2006.01)
(52) U.S. Cl. .................... 327/308; 327/108
(58) Field of Classification Search .......... None
See application file for complete search history.

(56) References Cited

U.S. PATENT DOCUMENTS

| | | | | |
|---|---|---|---|---|
| 4,255,715 | A * | 3/1981 | Cooperman | 330/9 |
| 4,484,295 | A * | 11/1984 | Bedard et al. | 708/8 |
| 4,975,604 | A | 12/1990 | Barta | |
| 6,091,264 | A * | 7/2000 | Kirsch et al. | 326/70 |
| 6,177,838 | B1 * | 1/2001 | Chiu | 330/253 |
| 6,657,486 | B2 * | 12/2003 | Kimura | 327/563 |
| 6,674,382 | B1 * | 1/2004 | Jordan | 341/144 |
| 6,703,682 | B2 * | 3/2004 | Aswell | 257/536 |
| 7,148,720 | B2 * | 12/2006 | Chen | 326/30 |

FOREIGN PATENT DOCUMENTS

| | | |
|---|---|---|
| JP | 60-165822 | 8/1985 |
| JP | 06-002827 | 1/1994 |
| JP | 10-200334 | 7/1998 |

OTHER PUBLICATIONS

Dogan et al, A DC-10GHz Linear-in-dB Attenuator in 0.13um CMOS Technology, IEEE 2004 Custom Integrated Circuits Conference, pp. 609-612.
Dogan, et al; IEEE 2004 Custom Integrated Circuit Conference; "A DC-10GHZ Linear-in-DB Attenuatror in . . . ".
Japanese Office Action mailed Oct. 28, 2008 corresponding to U.S. Appl. No. 11/936,214, filed on Nov. 7, 2007.

* cited by examiner

*Primary Examiner*—Cassandra Cox
(74) *Attorney, Agent, or Firm*—Turocy & Watson, LLP

(57) ABSTRACT

A MOS resistance controlling device includes: a plurality of MOS transistors having a first MOS transistor to N-th (the integer N is larger than 1) MOS transistor being serially connected, the source of the first MOS transistor being set to a first reference potential, the drain the N-th MOS transistor being set to a second reference potential, and the drain of an I-th MOS transistor being connected to the source of an I+1-th MOS transistor, where I is an integer from 1 to N−1; a current source which is electrically disposed at connection node between the drain of the N-th MOS transistors and the second reference potential; and an operational amplifier having a first input terminal being supplied with a third reference potential, a second input terminal connected with the connection node and an output terminal being connected with gates of the MOS transistors.

9 Claims, 7 Drawing Sheets

MOS RESISTANCE CONTROLLING DEVICE AND MOS ATTENUATOR

CROSS-REFERENCE TO RELATED APPLICATIONS

This application is based upon and claims the benefit of priority from the prior Japanese Patent Application No. 2006-303775, filed on Nov. 9, 2006; the entire contents of which are incorporated herein by reference.

BACKGROUND OF THE INVENTION

1. Field of the Invention

The present invention relates to a MOS resistance controlling device for controlling the resistance between the source and drain of a MOS transistor and a MOS attenuator having the MOS resistance controlling device.

2. Description of the Related Art

A MOS transistor is widely available as a resistance element for various electronic circuits. In this case, the linear region of the MOS transistor is utilized. In the linear region of the MOS transistor, the resistance "Rmos" between the drain and source of the MOS transistor can be approximately represented by the equation of $Rmos \approx 1/\{\beta \cdot (Vgs-Vth)\}$. Herein, $\beta=(\mu n \cdot Cox) \cdot (W/L)$ ($\mu n$: electron mobility, Cox: gate oxide capacitance per unit area, L: gate length of MOS transistor, W: gate width of MOS transistor, Vgs: voltage between gate and source of MOS transistor, Vth: threshold voltage). Therefore, the resistance "Rmos" can be varied by changing the gate voltage Vgs.

A MOS resistance controlling circuit is exemplified in Reference 1, and uses a feedback circuit with an operational amplifier. Schematically, the gate voltage to realize the intended MOS resistance is obtained through the feedback of the voltage between the source and drain of the MOS transistor to the operational amplifier. In this case, the gate voltage is applied to the gate of another MOS transistor so that another MOS transistor is controlled so as to have the intended MOS resistance.

A variable attenuator is disclosed in Reference 2 as an application circuit using the MOS resistance. Schematically, the MOS resistances are employed as a ground resistance and a passing resistance, respectively and the gate voltage of the MOS transistor to ground is varied so as to realize the variable attenuator. Since the characteristic impedance of the attenuator is shifted from a predetermined value (rendered non-matching state) if only the ground resistance is changed, a prescribed voltage is applied to the gate of the passing MOS transistor so that the characteristic impedance of the attenuator is set to the predetermined value. In order to obtain the predetermined voltage, a dummy circuit (replica) with a circuit structure similar to the one of the variable attenuator and a feedback circuit with an operational amplifier are provided.

The voltage generated according to Reference 1 can be supplied to the gate of the ground MOS transistor. In this case, even though the characteristics (e.g., threshold voltages) of the ground MOS transistor and the MOS transistor to supply the gate voltage are shifted similarly, the attenuation can be controlled precisely by the combination of the MOS transistors. However, if the operational amplifier in the controlling circuit of the MOS resistance has a DC offset, the variable attenuator is affected by the DC offset of the operational amplifier. References 1 and 2 do not teach the means for mitigating the above-described problem.

[Reference 1] JP-A 10-200334 (KOKAI)
[Reference 2] Hakan Dogan, Robert G. Meyer and Ali M. Niknejad BWRC, UC Berkeley, "A DC-10 GHZ Linear-in-dB Attenuator in 0.13 μm CMOS Technology", IEEE 2004 CUSTOM INTEGCONSTANT CIRCUITS CONFERENCE pp 609 to 612

BRIEF SUMMARY OF THE INVENTION

It is an object of the present invention to provide a MOS resistance controlling device to enhance the precision in control of the MOS resistance and a MOS attenuator having the MOS resistance controlling device.

In order to achieve the above object, an aspect of the present invention relates to a MOS resistance controlling device, including: a plurality of MOS transistors having a first MOS transistor to N-th (the integer N is larger than 1) MOS transistor being serially connected, the source of the first MOS transistor being set to a first reference potential, the drain the N-th MOS transistor being set to a second reference potential, and the drain of an I-th MOS transistor being connected to the source of an I+1-th MOS transistor, where I is an integer from 1 to N−1; a current source which is electrically disposed at connection node between the drain of the N-th MOS transistors and the second reference potential; and an operational amplifier having a first input terminal being supplied with a third reference potential, a second input terminal connected with the connection node and an output terminal being connected with gates of the MOS transistors.

In the MOS resistance controlling device according to the aspect, a plurality of MOS transistors are connected in series with one another and the output terminal of the operational amplifier is connected with the gates of the MOS transistors. Therefore, the input offset voltage of the operational amplifier is allotted to the MOS transistors, respectively so that the affection of the input offset voltage can be dispersed by the MOS transistors connected in series with one another. As a result, each MOS resistance of each MOS transistor can be controlled precisely.

Another aspect of the present invention relates to a MOS attenuator, including: a plurality of MOS transistors which are connected in series with one another so that each source is connected with each drain and an outermost source in the MOS transistors is set to a first reference potential; a current source which is electrically disposed between an outermost drain in the MOS transistors and a second reference potential; a first operational amplifier having a first input terminal, a second input terminal and an output terminal so that a third reference potential is supplied to the first input terminal and the second input terminal is connected with a connection node electrically disposed between the outermost drain and the second reference potential, and the output terminal is connected with gates of the MOS transistors; a first attenuator having an input terminal, an output terminal, a plurality of ground MOS transistors and at least one passing MOS transistor, the ground MOS transistors and the passing MOS transistor being disposed between the input terminal and the output terminal of the first attenuator, so that the output terminal of the first operational amplifier is connected with gates of the ground MOS transistors and a control voltage is supplied to a gate of the at least one passing MOS transistor so as to set a characteristic impedance between the input terminal and the output terminal to a predetermined value; a first resistor, electrically disposed between the input terminal of the first attenuator and a fourth reference potential, having an impedance corresponding to the characteristic impedance; a second resistor, electrically disposed between the output terminal of the first attenuator and a fifth reference potential, having an impedance corresponding to the characteristic impedance; a second operational amplifier to generate an amplified output signal in comparison with a voltage at the output terminal of the first attenuator and a predetermined voltage and to output the amplified output signal as the control voltage; and a second attenuator having an input terminal, an output terminal, a plurality of ground MOS transistors and at least one passing MOS transistor, the ground MOS transistors and the passing MOS transistor being disposed between the input terminal and the output terminal of the second attenuator, so that the output terminal of the first operational amplifier is connected with gates of the ground MOS transistors and the control voltage is supplied to a gate of the at least one passing MOS transistor.

The MOS attenuator utilizes the MOS resistance controlling device as described above. In this case, the output voltage of the MOS resistance controlling device is supplied so as to generate the MOS resistances of the ground MOS transistors in the attenuator. As a result, the MOS resistances of the ground MOS transistors can be controlled precisely so that the attenuation of the attenuator can be controlled as designed.

According to the aspects of the present inventions, the control precision in MOS resistance of the MOS resistance controlling device and the MOS attenuator can be enhanced.

DETAILED DESCRIPTION OF THE INVENTION

In an embodiment, the semiconductor area for a channel of each MOS transistor to be formed is electrically set to the first reference potential. Generally, the MOS transistor includes a semiconductor area (e.g., semiconductor substrate) for the channel to be formed. Therefore, if the first reference potential is set to the semiconductor area, the manufacturing process of a semiconductor device including the MOS transistors and the chip area of the semiconductor device can be reduced.

In another embodiment, the semiconductor area for a channel of each MOS transistor to be formed is electrically set to a source potential of each MOS transistor. In this case, the semiconductor area for the channel of each MOS transistor to be formed is set to the source potential thereof so that the fluctuation in characteristic (e.g., threshold value) between the MOS transistors due to the substrate effect can be prevented and thus, the output voltage can be generated at the output terminal of the operational amplifier as designed.

In still another embodiment, the gate length and gate width of the MOS transistors are set equal to the gate length and gate width of at least one selected from among the ground MOS transistors in the first attenuator. In this case, since the attenuator can be structured in the same manner as the MOS resistance controlling device in view of the structure of MOS transistor, the error for the designed attenuation characteristic can be reduced.

In a further embodiment, the gate length of the MOS transistors are set equal to the gate length of at least one selected from among the ground MOS transistors in the first attenuator, and the gate width of the MOS transistors are set to a predetermined ratio for the gate width of at least one selected from among the ground MOS transistors in the first attenuator. In this case, if the gate width of the ground MOS transistors in the first attenuator is decreased, the current to be flowed in the MOS transistors can be reduced and thus, the electric power saving can be realized.

Figure 1:
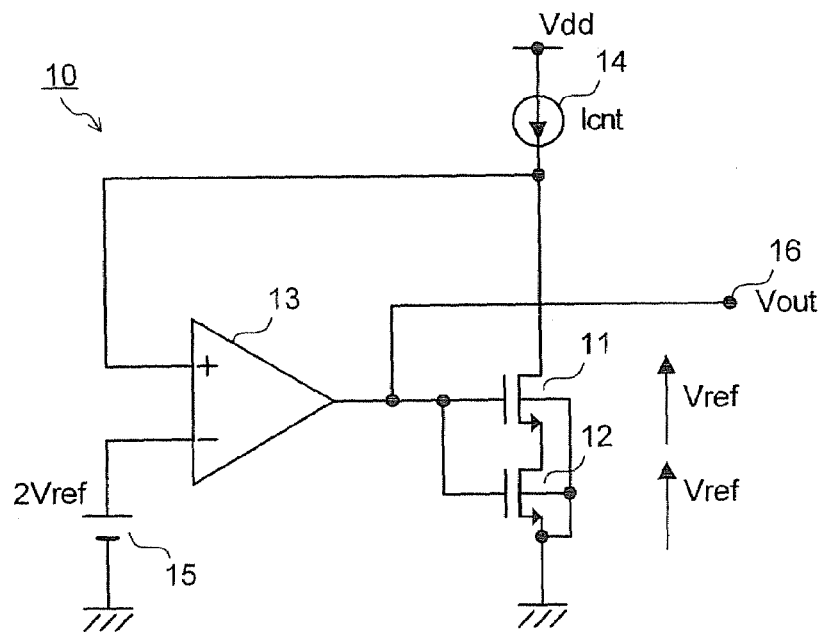
FIG. 1 is a circuit diagram relating to a MOS resistance controlling device according to an embodiment.

The embodiments will be described with reference to drawings. FIG. 1 is a circuit diagram relating to a MOS resistance controlling device according to an embodiment. As shown in FIG. 1, the MOS resistance controlling device 10 includes MOS transistors 11, 12, an operational amplifier 13, a constant current source 14 and a standard voltage source 15. The output of the operational amplifier 13 corresponds to the output Vout of the MOS resistance controlling device 10.

The MOS transistors 11 and 12 are n-channel MOS transistors so that the source of the MOS transistor 11 is connected in series with the drain of the MOS transistor 12 and the source of the MOS transistor 12 is electrically grounded (first reference potential). Then, in the MOS transistors 11 and 12, the semiconductor areas (in the corresponding semiconductor substrates) for the channels of the MOS transistors 11 and 12 to be formed are electrically grounded, as depicted in FIG. 1. Then, the drain of the MOS transistor 11 is connected with one end of the constant current source 14. A common output voltage is applied to the gates of the MOS transistors 11 and 12 from the operational amplifier 13.

The operational amplifier 13 includes two input terminal and an output terminal so that the voltage of the standard voltage source 15 (third reference potential) is supplied as an inverting input to one of the input terminals of the operational amplifier 13 and the voltage generated at the connection node between the MOS transistor 11 and the constant current source 14 is supplied as a non-inverting input to the other of the input terminals of the operational amplifier 13. The output terminal of the operational amplifier 13 is connected with the gates of the MOS transistors 11 and 12. The constant current source 14 is disposed between the drain of the MOS transistor 11 and the Vdd (second reference potential) so that the current Icnt can be flowed in the MOS transistor 11. The standard voltage source 15 generates a reference potential of 2Vref at the ends of the MOS transistors 11 and 12. Since the one of the input terminals is shorted imaginarily for the other of the input terminals, a voltage corresponding to the reference potential of 2Vref is generated at the ends of the MOS transistors 11 and 12.

Figure 2:
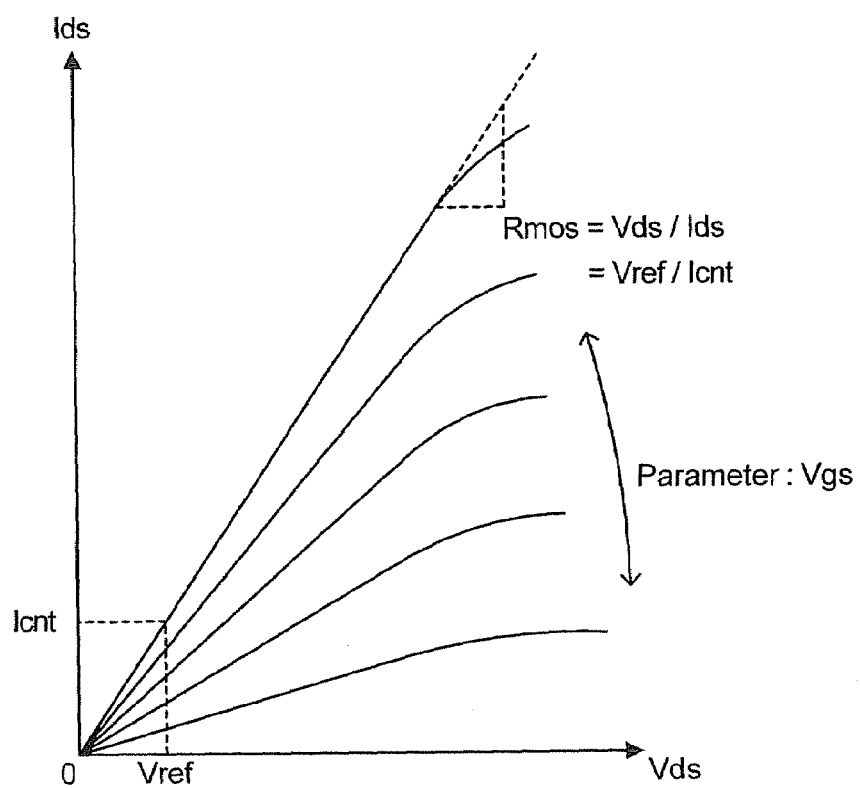
FIG. 2 is a characteristic view for explaining the operation of the embodiment shown in FIG. 1.

FIG. 2 is a characteristic view for explaining the operation of the MOS resistance controlling device shown in FIG. 1. The abscissa axis designates the source/drain voltage Vds of the MOS transistor 11 or 12 and the ordinate axis designates the drain current Ids of the MOS transistor 11 or 12. When the gate/source voltage Vgs of the MOS transistor 11 or 12 is changed, the MOS resistance Rmos=Vds/Ids of the MOS transistor 11 or 12 is also changed (the relation between the source/drain voltage Vds and the drain current Ids becomes linear in the vicinity of the original point. Referring to the circuit diagram shown in FIG. 1, the MOS resistance Rmos can be represented by "Vref/Icnt". Therefore, the Vref and Icnt can be defined as a given point of the line depicted in FIG. 2.

Strictly, since the gate/source voltage Vgs of the MOS transistor 11 is different from the gate/source voltage Vgs of the MOS transistor 12, the source/drain voltage Vds of the MOS transistor 11 is also different from the source/drain voltage Vds of the MOS transistor 12. If the difference in gate/source voltage Vgs between the MOS transistors 11 and 12 is small (substantially equal to one another), the source/drain voltage Vds of the MOS transistor 11 becomes almost equal to the source/drain voltage Vds of the MOS transistor 12 (in this case, the source/drain voltage Vds can be represented by "Vref").

The output voltage of the operational amplifier 13 which is supplied as the gate voltage of the MOS transistor 12 is a voltage to generate the same MOS resistance in another MOS transistor to be connected with the output terminal 16 as the MOS resistance in the MOS transistor 12. In this case, the size (gate length and gate width) of another MOS transistor is set equal to the size of the MOS transistor 12. In the case that the gate length of another MOS transistor is set equal to the gate length of the MOS transistor 12, if the gate width of the another MOS transistor is set larger than the gate width of the MOS transistor 12, the MOS resistance of another MOS transistor becomes larger than the MOS resistance of the MOS transistor 12. In other words, when the gate length of another MOS transistor is set equal to the gate length of the MOS transistor 12, the MOS resistance of another MOS transistor is shifted from the MOS resistance of the MOS transistor 12 dependent on the difference in gate width between another MOS transistor and the MOS transistor 12.

Figure 3:
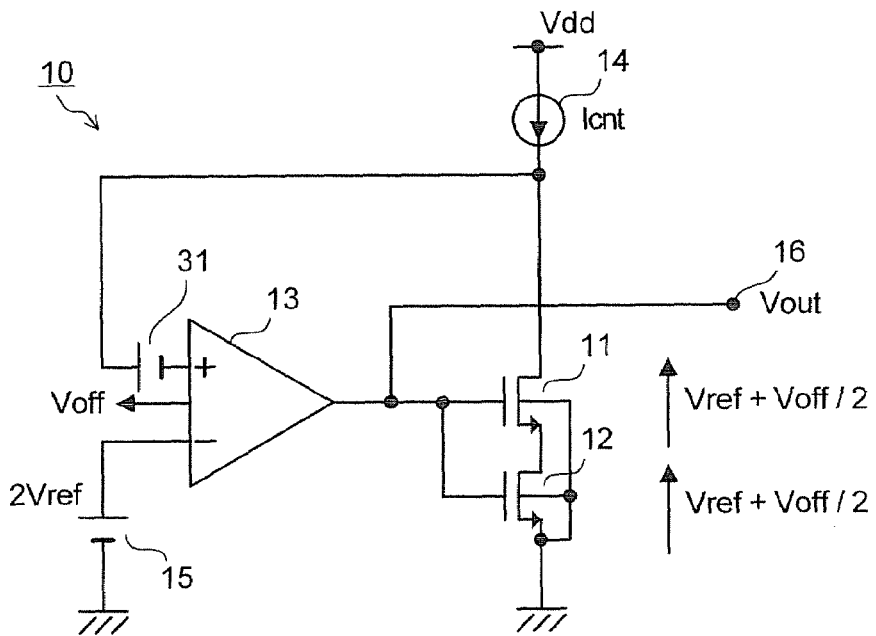
FIG. 3 is a circuit diagram for explaining the affection of the offset of the operational amplifier in the embodiment shown in FIG. 1.

FIG. 3 is a circuit diagram for explaining the affection of the offset of the operational amplifier in the MOS resistance controlling device shown in FIG. 1. As shown in FIG. 3, the DC offset Voff of the operational amplifier 13 can be considered to be added to the input terminal of the operational amplifier 13 as an electric power source 31. In this case, the source/drain voltages of the MOS transistors 11 and 12 are set to "Vref+Voff/2", respectively. Namely, the half of the DC offset Voff of the operational amplifier 13 is allotted to the MOS transistors hand 12, respectively so that the MOS transistors 11 and 12 are affected equally by the DC offset Voff of the operational amplifier 13.

Figure 4:
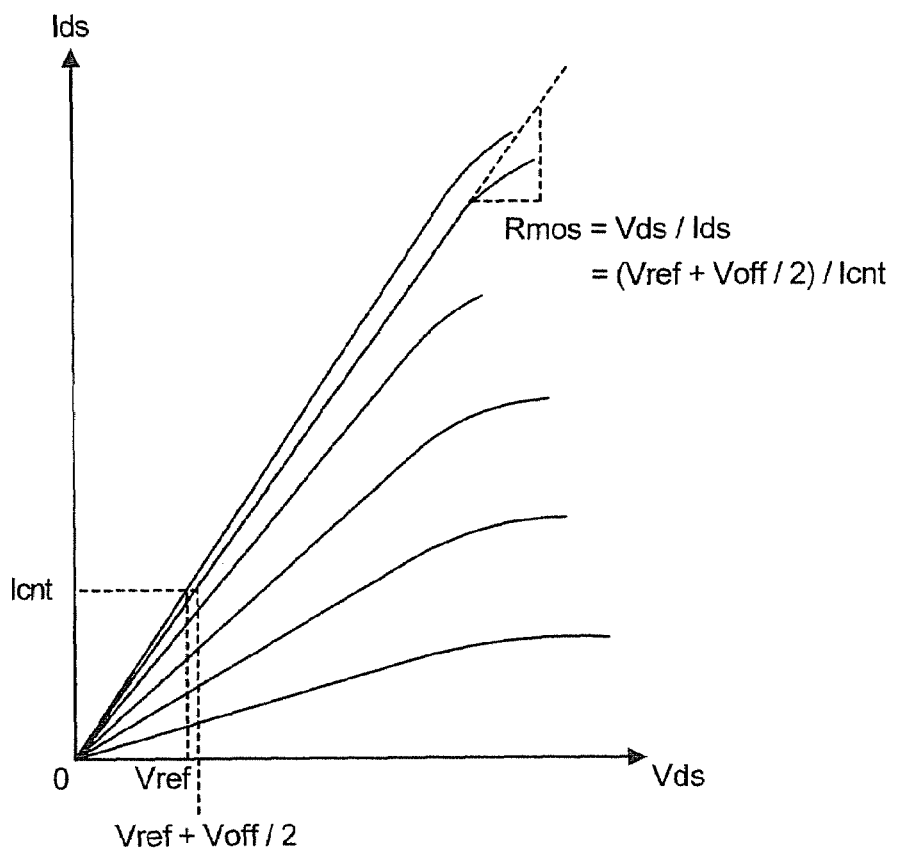
FIG. 4 is a characteristic view for explaining the operation of the embodiment shown in FIG. 1 in view of the affection of the offset of the operational amplifier relating to FIG. 3.

FIG. 4 is a characteristic view for explaining the operation of the MOS resistance controlling device shown in FIG. 1 in view of the affection of the offset of the operational amplifier relating to FIG. 3. As shown in FIG. 3, since the source/drain voltage Vds is shifted from "Vref" to "Vref+Voff/2" in the MOS transistors 11 and 12, the MOS resistance Rmos is also shifted from "Vref/Icnt" to "(Vref+Voff/2)/Icnt" in the MOS transistors 11 and 12.

Figure 5:
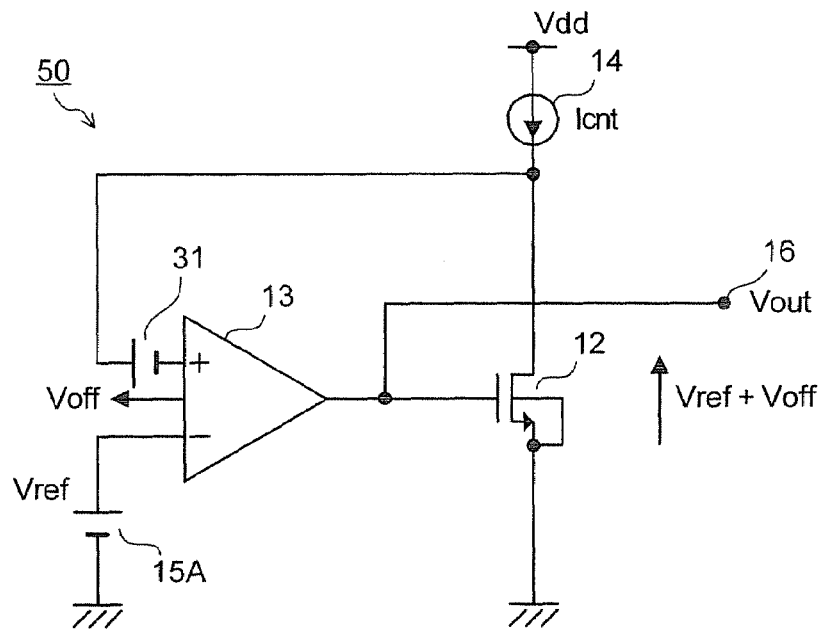
FIG. 5 is a reference circuit diagram for the embodiment shown in FIG. 1.

FIG. 5 is a reference circuit diagram for the MOS resistance controlling device shown in FIG. 1. Like or corresponding components are designated by the same reference numerals throughout the drawings. In the MOS resistance controlling device 50, the MOS transistor 11 is not connected in series with the MOS transistor 12 and the standard voltage Vref is supplied as the inverting input to the input terminal of the operational amplifier 13 from the standard voltage source 15A.

Figure 6:
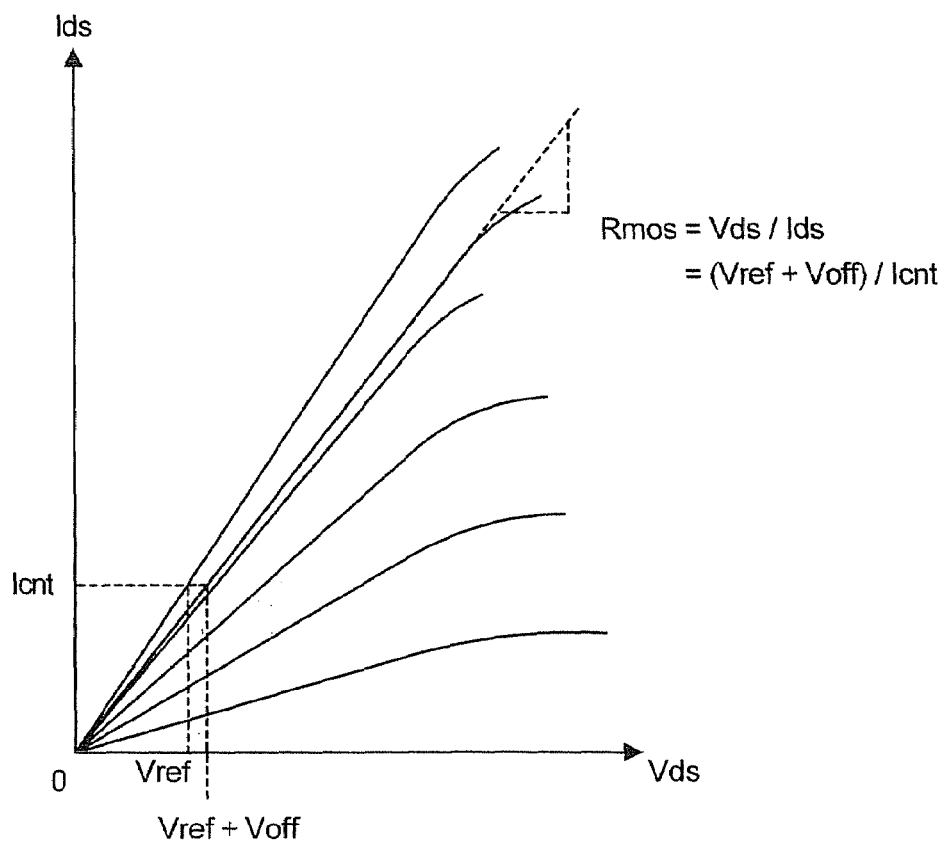
FIG. 6 is a characteristic view for explaining the operation of the circuit shown in FIG. 5.

FIG. 6 is a characteristic view for explaining the operation of the circuit shown in FIG. 5. As shown in FIG. 6, since the source/drain voltage Vds of the MOS transistor 12 is shifted to "Vref+Voff", the MOS resistance Rmos of the MOS transistor 12 is also shifted to "(Vref+Voff/2)/Icnt". In comparison with the MOS transistor 12 in FIG. 3, the MOS transistor 12 in FIG. 5 is largely affected by the DC offset Voff of the operational amplifier 13 (twice affected). Therefore, the MOS resistance of another MOS transistor to be connected with the output terminal 16 is largely shifted from the intended MOS resistance. As a result, the MOS resistance of another MOS transistor to be connected with the output terminal 16 in FIG. 3(FIG. 1) can be controlled more precisely than the MOS resistance of another MOS transistor in FIG. 5.

Figure 7:
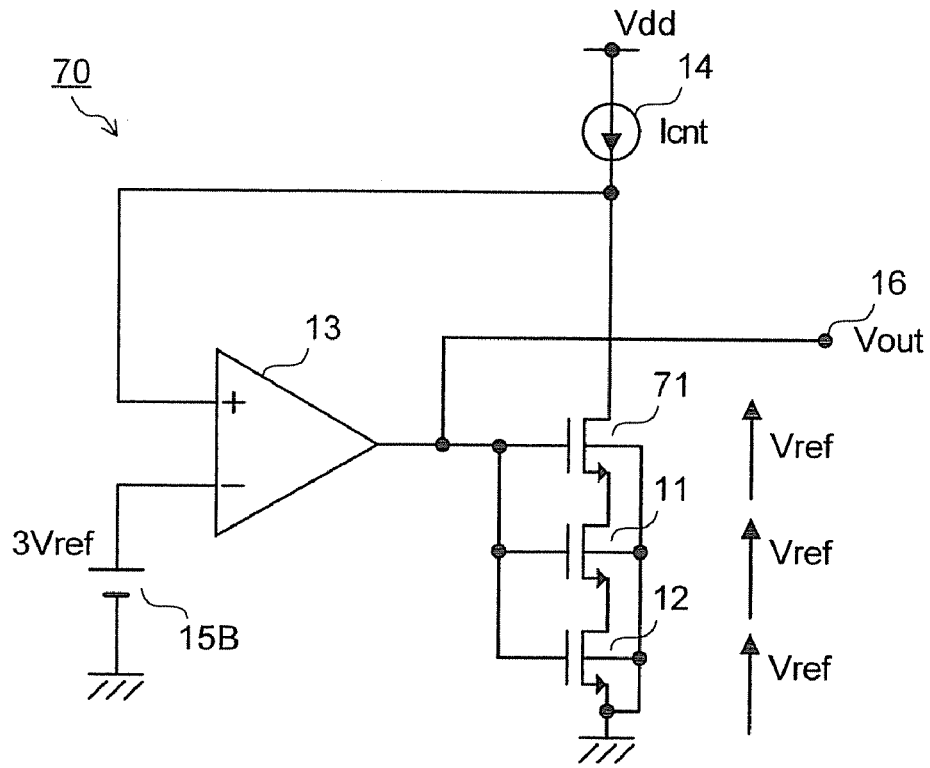
FIG. 7 is a circuit diagram relating to a MOS resistance controlling device according to another embodiment.

FIG. 7 is a circuit diagram relating to a MOS resistance controlling device according to another embodiment. Like or corresponding components are designated by the same reference numerals throughout the drawings, and not explained.

In this embodiment, a MOS transistor 71 is connected in series with the MOS transistors 11 and 12. The output voltage of the operational amplifier 13 is supplied to the gate of the MOS transistor 71. Then, the output voltage of 3Vref is supplied as a reference potential to the inverting input terminal of the operational amplifier 13.

In this case, the source/drain voltages of the MOS transistors 71, 11 and 12 are set to "Vref", respectively so that the offset voltage of the operational amplifier 13 is also allotted equally to the MOS transistors 71, 11 and 12. Therefore, the MOS resistance of the MOS transistor 12 can be generated under the condition of small affection of the offset voltage. If the number of MOS transistor to be connected in series is increased, the affection of the offset voltage can be much reduced.

Figure 8:
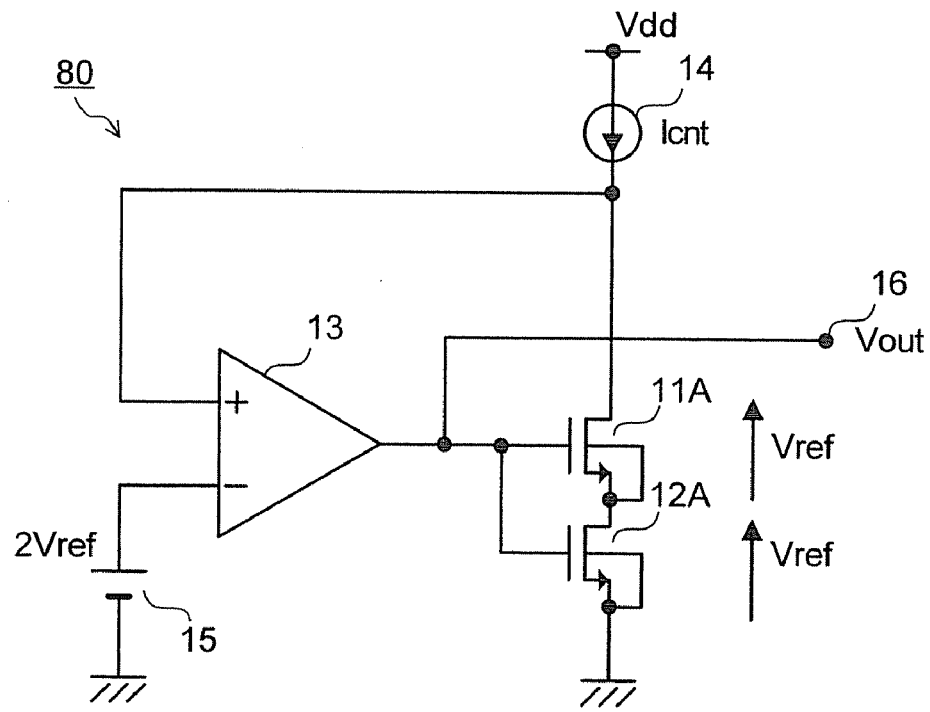
FIG. 8 is a circuit diagram relating to a MOS resistance controlling device according to still another embodiment.

FIG. 8 is a circuit diagram relating to a MOS resistance controlling device according to still another embodiment. Like or corresponding components are designated by the same reference numerals throughout the drawings, and not explained.

In this embodiment, the MOS transistors 11A and 12A are provided instead of the MOS transistors 11 and 12 as shown in FIG. 1. In this embodiment, the semiconductor areas (in the corresponding semiconductor substrates) for the channels of the MOS transistors 11A and 12A to be formed are set to the corresponding source potentials so that the substrate effect can be prevented and thus, the circuit design can be simplified. The substrate effect means the change in threshold voltage of a MOS transistor by the difference between the substrate voltage and the source voltage.

Figure 9:
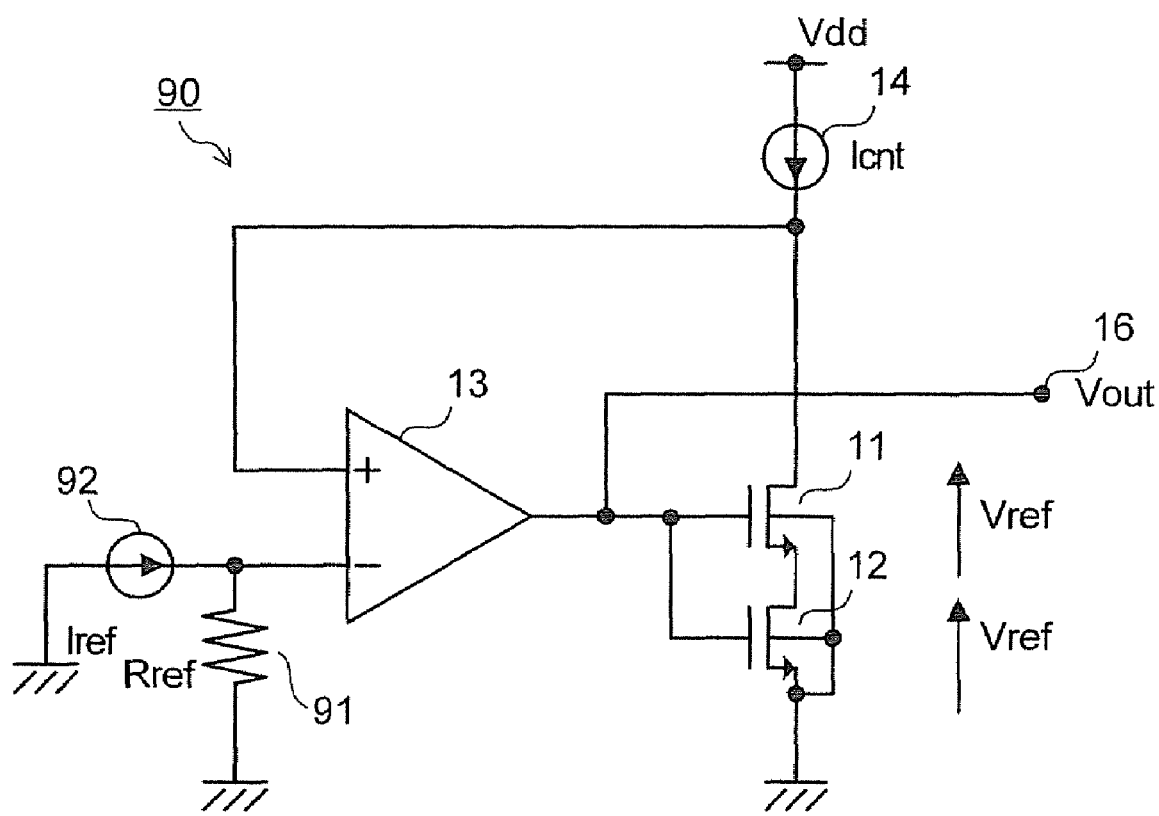
FIG. 9 is a circuit diagram relating to a MOS resistance controlling device according to a further embodiment.

FIG. 9 is a circuit diagram relating to a MOS resistance controlling device according to a further embodiment. Like or corresponding components are designated by the same reference numerals throughout the drawings, and not explained.

In the MOS resistance controlling device 90, a resistance 91 and a standard current source 92 to flow a current Iref in the resistance 91 are provided instead of the standard voltage source 15. Other components are provided in the same manner as in FIG. 1. In this case, if the current Iref and the current Icnt can be flowed in relation to one another from the standard current source 92 and the constant current source 14, respectively, the intended output voltage with small error can be generated at the output terminal 16.

Figure 10:
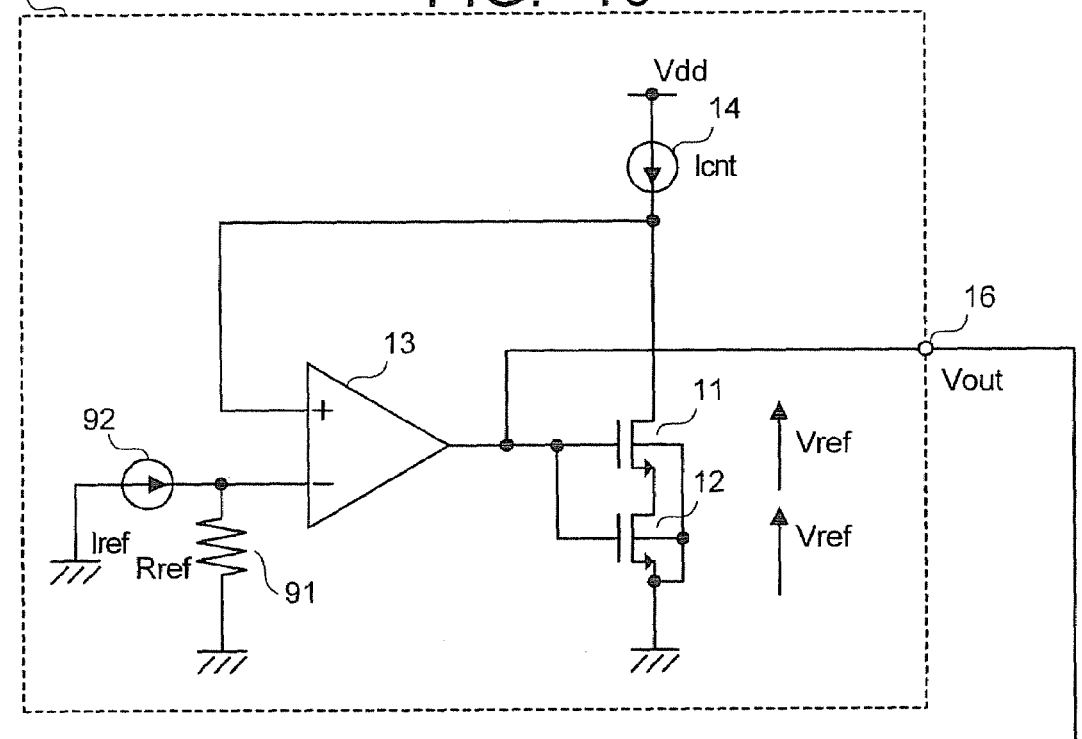
FIG. 10 is a circuit diagram relating to a MOS attenuator according to an embodiment.
Figure 10:
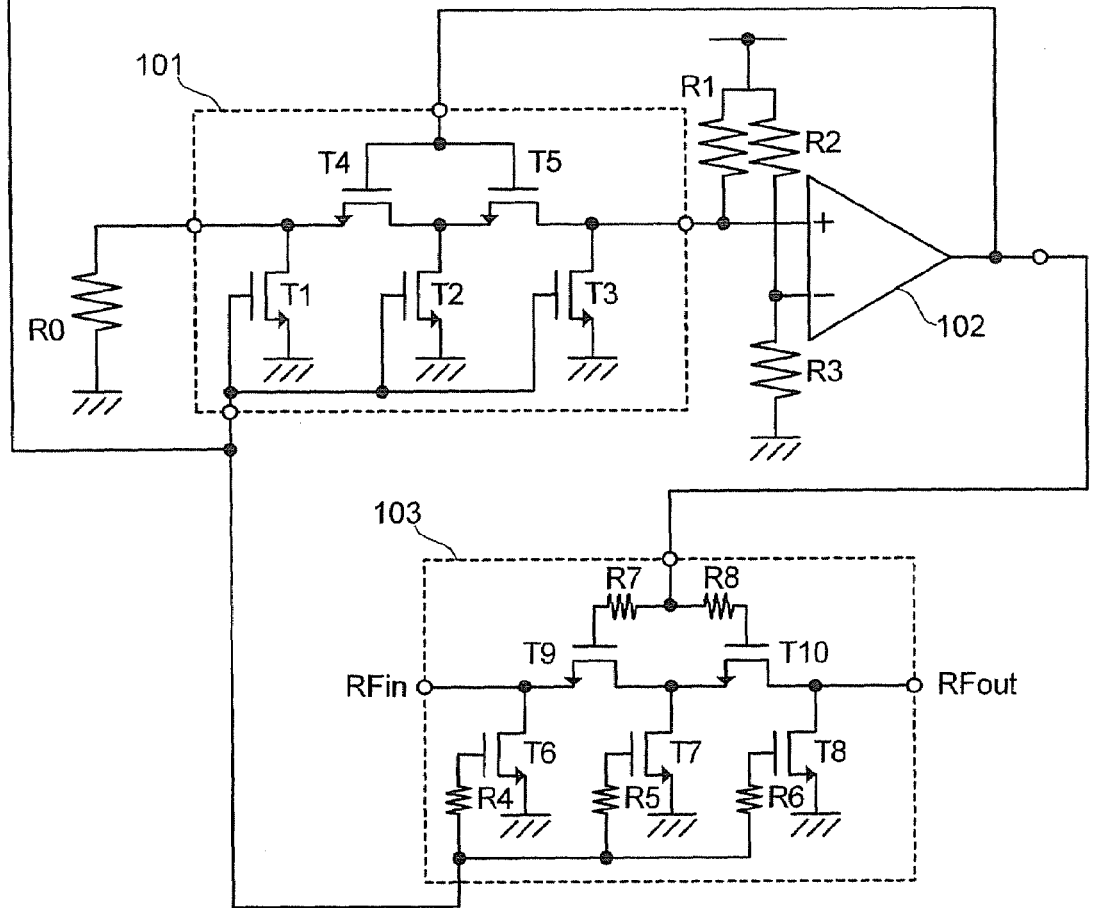

FIG. 10 is a circuit diagram relating to a MOS attenuator according to an embodiment. Like or corresponding components are designated by the same reference numerals throughout the drawings, and not explained.

In this embodiment, the MOS attenuator utilizes the MOS resistance controlling device 90 shown in FIG. 9. Therefore, the attenuation of the MOS attenuator can be varied by changing the current Iref of the standard current source 92. The MOS attenuator includes a dummy (replica) attenuator 101 containing MOS transistors and a real attenuator 103 for passing signals containing MOS transistors in addition to the MOS resistance controlling device 90.

With the dummy attenuator 101, a resistance R0 corresponding to the impedance of a signal source is connected to the input terminal thereof. The one end of the resistance R0 is electrically grounded. Then, a resistance R1 corresponding to the terminating resistance is connected to the output terminal thereof. The one end of the resistance R1 is electrically connected to the Vdd. In the dummy attenuator 101, ground MOS transistors T1, T2, T3 and passing MOS transistors T4, T5 are provided. The output voltage of the MOS resistance controlling device 90 is supplied to the gates of the MOS transistors T1, T2, T3, respectively. Then, the output of the operational amplifier 102 is supplied to the gates of the MOS transistors T4, T5 so that the characteristic impedance of the dummy attenuator 101 can be set to a predetermined value.

The real attenuator 103 is structured in the same manner as the dummy attenuator 101. The resistances R4, R5, R6, R7 and R8, which are connected to the gates of the MOS transistors T6, T7, T8, T9 and T10, respectively, reduce high frequency signals input into the attenuator 103. Therefore, the high frequency signals can be reduced remarkably through the attenuator 103. Then, the output voltage of the MOS resistance controlling device 90 is supplied to the gates of the MOS transistors T6, T7, T8. Moreover, the output of the operational amplifier 102 is supplied to the gates of the MOS transistors T9, T10.

The output terminal of the dummy attenuator 101 is connected with the resistance R1 and the non-inverting input terminal of the operation amplifier 102. The voltage generated at the node between the resistances R2 and R3 is supplied to the inverting input terminal of the operational amplifier 102. In this case, since the input terminals of the operational amplifier 102 are shorted imaginarily, the output of the operational amplifier 102 is fed back to the dummy attenuator 101 (concretely, to the gates of the MOS transistors T4, T5) so that the resistance R3 is provided imaginarily in the attenuator 101 when the resistance R1 is set equal to the resistance R2. Therefore, if the resistance R2 and R3 are set to a predetermined characteristic impedance, the characteristic impedance of the attenuator 101 can be set to the predetermined characteristic impedance. In this case, the characteristic impedance of the attenuator 103 is also set to the predetermined characteristic impedance.

In the MOS attenuator as shown in FIG. 10, the output voltage of the MOS resistance controlling device 90 is supplied to the gates of the MOS transistors T1, T2, T3, T6, T7, T8 in the attenuator 101 and 103. Therefore, the intended MOS resistance with small affection of the offset voltage of the operational amplifier 13 can be generated at the MOS transistors T1, T2, T3, T6, T7, T8. The error for the designed attenuation characteristic can be reduced. In order to enhance the reduction of the error, it is desired that the MOS resistance controlling device 90 is provided in the vicinity of the attenuators 101 and 103 so that the MOS transistors 11 and 12 in the device 90 can be related with the MOS transistors T1, T2, T3, T6, T7, T8.

The MOS transistor T2 is shared with two sets of circuits in the dummy attenuator 101 and the MOS transistor T7 is shared with two sets of π circuits in the real attenuator 103. Therefore, it is desired that the MOS resistance of the MOS transistor T2 and/or T7 is decreased half as large as the MOS resistance of the MOS transistors T1, T3 and/or T6, T8 by increasing the size (gate width) of the MOS transistor T2 and/or T7 twice as large as the sizes (gate widths) of the MOS transistors T1, T3 and/or T6, T8. In this case, the current density in the MOS transistor T2 and/or T7 can be set equal to the current density in the MOS transistors T1, T3 and/or T6, T8.

Under the above-described condition, the sizes (gate widths) of the MOS transistors T1, T2, T3 in the dummy attenuator 101 may be set smaller than the sizes (gate widths) of the MOS transistors 11 and 12 in the MOS resistance controlling device 90. In this case, since the current flowing in the dummy attenuator 101 can be reduced, the electric power saving can be realized for the attenuator 101 (that is, the MOS attenuator shown in FIG. 10). For simplifying the manufacturing process, it is desired that the gate lengths of the MOS transistors are set equal to one another irrespective of the gate widths thereof.

Figure 11:
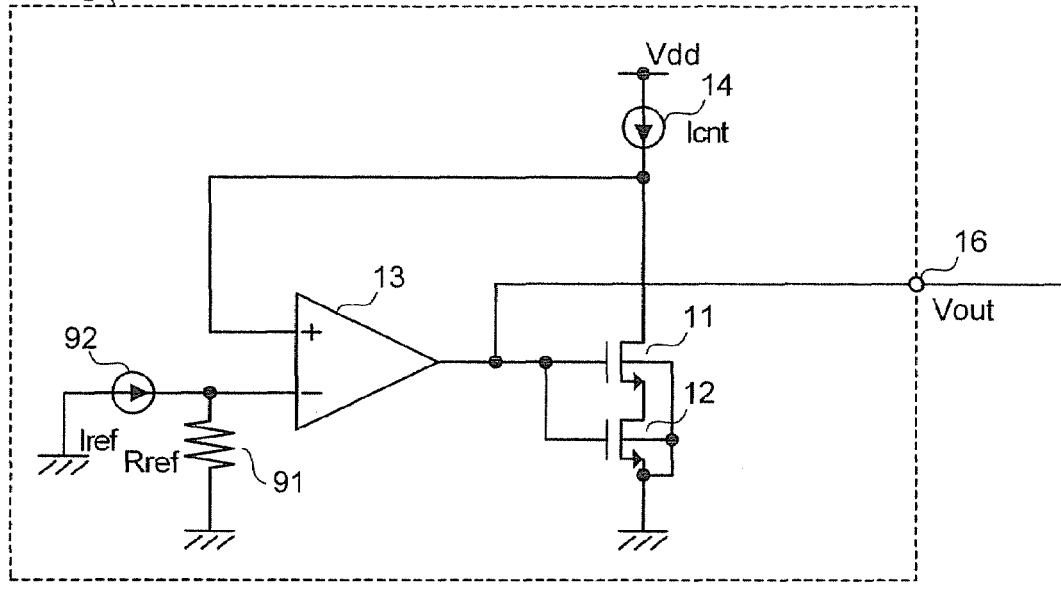
FIG. 11 is a circuit diagram relating to a MOS attenuator according to another embodiment.
Figure 11:
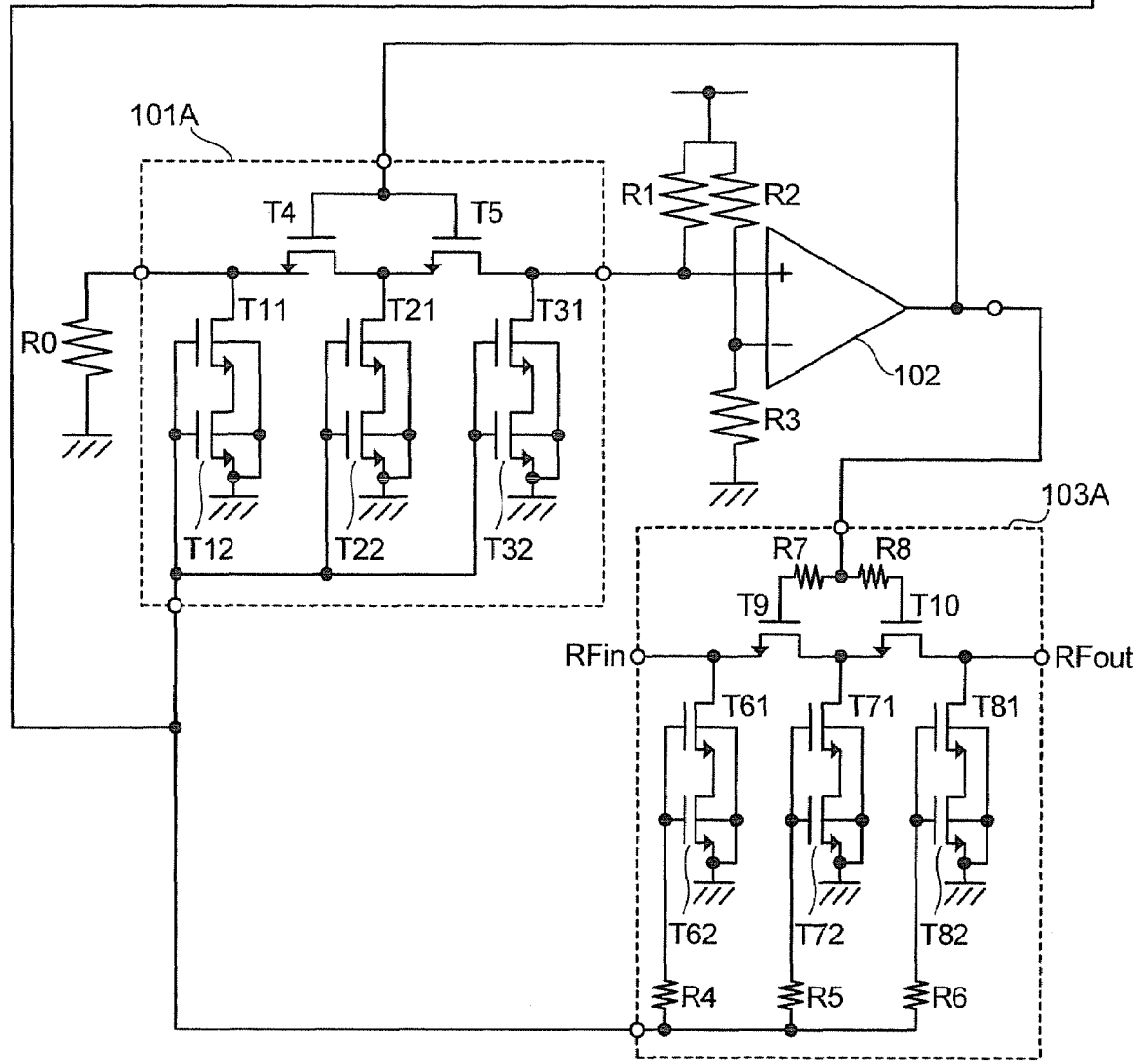

FIG. 11 is a circuit diagram relating to a MOS attenuator according to another embodiment. In this embodiment, MOS transistors T11, T12, T21, T22, T31, T32 are provided in a dummy attenuator 101A instead of the MOS transistors T1, T2, T3 in the dummy attenuator 101. The MOS transistors T11 and T12; T21 and T22; T31 and T32 are structured in the same manner as the MOS transistors 11 and 12 in the MOS resistance controlling device 90. The MOS transistors T11 and T12 are configured such that the source of the MOS transistor T11 is connected in series with the drain of the MOS transistor T12 and the source of the MOS transistor T12 is electrically grounded (first reference potential). The semiconductor areas (in the corresponding semiconductor substrates) for the channels of the MOS transistors T11 to T32 to be formed are electrically grounded, as depicted in FIG. 1.

In this embodiment, MOS transistors T61, T62, T71, T72, T81, T82 are provided in a real attenuator 103A instead of the MOS transistors T6, T7, T8 in the real attenuator 103. The MOS transistors T61 and T62; T71 and T72; T81 and T82 are structured in the same manner as the MOS transistors 11 and 12 in the MOS resistance controlling device 90. The MOS transistors T61 and T62 are configured such that the source of the MOS transistor T61 is connected in series with the drain of the MOS transistor T62 and the source of the MOS transistor T62 is electrically grounded (first reference potential). The semiconductor areas (in the corresponding semiconductor substrates) for the channels of the MOS transistors T61 and T82 to be formed are electrically grounded, as depicted in FIG. 1.

Although the present invention was described in detail with reference to the above examples, this invention is not limited to the above disclosure and every kind of variation and modification maybe made without departing from the scope of the present invention. For example, some constituents in one embodiment may be combined with some constituents in another embodiment. Moreover, some constituents in one embodiment may be omitted appropriately.

What is claimed is:

1. A MOS attenuator, comprising:
   a plurality of MOS transistors having a first MOS transistor to N-th (the integer N is larger than 1) MOS transistor being serially connected, the source of the first MOS transistor being set to a first reference potential, the drain of the N-th MOS transistor being set to a second reference potential, and the drain of an I-th MOS transistor being connected to the source of an I+1-th MOS transistor, where I is an integer from 1 to N−1;

a current source which is electrically disposed at a connection node between the drain of the N-th MOS transistors and the second reference potential; and a first operational amplifier having a first input terminal, a second input terminal and an output terminal, a third reference potential being supplied to the first input terminal, and the second input terminal being connected with a connection node electrically disposed between the drain of the N-th transistor and the second reference potential, and the output terminal being connected with gates of the MOS transistors;

a first attenuator having an input terminal, an output terminal, a plurality of ground MOS transistors and at least one passing MOS transistor, the ground MOS transistors and the passing MOS transistor being disposed between the input terminal and the output terminal of the first attenuator, so that the output terminal of the first operational amplifier is connected with gates of the ground MOS transistors and a control voltage is supplied to a gate of the at least one passing MOS transistor so as to set a characteristic impedance between the input terminal and the output terminal to a predetermined value;

a first resistor, electrically disposed between the input terminal of the first attenuator and a fourth reference potential, having an impedance corresponding to the characteristic impedance;

a second resistor, electrically disposed between the output terminal of the first attenuator and a fifth reference potential, having an impedance corresponding to the characteristic impedance;

a second operational amplifier to generate an amplified output signal in comparison with a voltage at the output terminal of the first attenuator and a predetermined voltage and to output the amplified output signal as the control voltage; and a second attenuator having an input terminal, an output terminal, a plurality of ground MOS transistors and at least one passing MOS transistor, the ground MOS transistors and the passing MOS transistor being disposed between the input terminal and the output terminal of the second attenuator, so that the output terminal of the first operational amplifier is connected with gates of the ground MOS transistors and the control voltage is supplied to a gate of the at least one passing MOS transistor.

2. The attenuator as set forth in claim 1,
wherein a gate length and gate width of the MOS transistors are set equal to a gate length and gate width of at least one selected from among the ground MOS transistors in the first attenuator.

3. The attenuator as set forth in claim 1,
wherein a gate length of the MOS transistors are set equal to a gate length of at least one selected from among the ground MOS transistors in the first attenuator;
wherein a gate width of the MOS transistors are set to a predetermined ratio for a gate width of at least one selected from among the ground MOS transistors in the first attenuator.

4. The attenuator as set forth in claim 1,
wherein a semiconductor area for a channel of each MOS transistor to be formed is electrically set to the first reference potential.

5. The attenuator as set forth in claim 1,
wherein a semiconductor area for a channel of each MOS transistor to be formed is electrically set to a source potential of each MOS transistor.

6. The attenuator as set forth in claim 1,
wherein an electric potential of the first input terminal of the first operational amplifier is set equal to an electric potential of the second input terminal of the first operational amplifier.

7. The attenuator as set forth in claim 1,
wherein an electric potential of the first input terminal of the second operational amplifier is set equal to an electric potential of the second input terminal of the second operational amplifier.

8. The device as set forth in claim 6,
wherein the third reference potential is defined by a voltage from a standard voltage source.

9. The device as set forth in claim 6,
wherein the third reference potential is defined by a resistance and a current from a standard current source to be flowed in the resistance.

* * * * *